(12) United States Patent
Takigawa (10) Patent No.: US 9,667,030 B2
(45) Date of Patent: May 30, 2017

(54) LASER APPARATUS IN WHICH LASER OSCILLATION PART, AIR COOLING MACHINE AND DEHUMIDIFIER ARE COOLED BY COMMON COOLING WATER

(71) Applicant: FANUC CORPORATION, Minamitsuru-gun, Yamanashi (JP)

(72) Inventor: Hiroshi Takigawa, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/177,801

(22) Filed: Jun. 9, 2016

(65) Prior Publication Data

US 2016/0365701 A1 Dec. 15, 2016

(30) Foreign Application Priority Data

Jun. 11, 2015 (JP) ................................. 2015-118419

(51) Int. Cl.
*H01S 5/024* (2006.01)
*H01S 5/022* (2006.01)

(52) U.S. Cl.
CPC .......... *H01S 5/02423* (2013.01); *H01S 5/022* (2013.01); *H01S 5/0222* (2013.01); *H01S 5/02407* (2013.01); *H01S 5/02469* (2013.01); *H01S 5/02415* (2013.01)

(58) Field of Classification Search
CPC ............. H01S 5/02423; H01S 5/02469; H01S 5/02415; H01S 5/02407
See application file for complete search history.

(56) References Cited

U.S. PATENT DOCUMENTS

| 5,802,087 A * | 9/1998 | Takaichi | H01S 3/042 372/35 |
| 2003/0132210 A1* | 7/2003 | Fujii | B23K 26/123 219/121.84 |
| 2005/0135452 A1* | 6/2005 | Ishizu | H01S 3/042 372/70 |

FOREIGN PATENT DOCUMENTS

| JP | 2001-326410 A | 11/2001 |
| JP | 3338974 B | 10/2002 |
| JP | 2015-012063 A | 1/2015 |
| JP | 5651396 B | 1/2015 |

* cited by examiner

*Primary Examiner* — Kinam Park
(74) *Attorney, Agent, or Firm* — RatnerPrestia (57) ABSTRACT

The laser apparatus includes a laser oscillation part including a water-cooled plate, an air cooling machine including a radiator, a dehumidifier including a water-cooled plate, and a cooling water supply device including a cooling water pipe through which a cooling water is supplied. The air cooling machine and the dehumidifier are arranged in a housing. The cooling water pipe is branched so that the water-cooled plate in the laser oscillation part, the radiator, and the water-cooled plate in the dehumidifier are connected in parallel. The cooling water supply device supplies a common cooling water of the same temperature to the water-cooled plate in the laser oscillation part, the radiator, and the water-cooled plate in the dehumidifier.

8 Claims, 6 Drawing Sheets

LASER APPARATUS IN WHICH LASER OSCILLATION PART, AIR COOLING MACHINE AND DEHUMIDIFIER ARE COOLED BY COMMON COOLING WATER

BACKGROUND OF THE INVENTION

1. Field of the Invention

The present invention relates to a laser apparatus.

2. Description of Related Art

There is known a laser apparatus which is provided with a mechanism for cooling a laser light source since the laser light source generates heat. In particular, a high power laser apparatus uses a cooling water to cool the laser light source. However, when air having a high humidity contacts the portion which has been cooled by the cooling water and whose temperature has been lowered, waterdrops adhere thereto due to dew condensation. The waterdrops may result in a breakdown of the laser apparatus.

For instance, in a laser apparatus using a laser diode as the light source, a drive voltage is applied to micro elements, and accordingly, the internal electric field intensity is large. If a waterdrop adheres to an electrode, etc., of the laser diode, a short circuit easily occurs, so that there may be a critical damage to the laser diode. Furthermore, in a carbon dioxide laser apparatus, a high voltage is applied in order to oscillate a laser light. Therefore, if dew condensation occurs in the laser apparatus, a spark may occur and may damage electrodes or peripheral parts. In addition to the foregoing, if a water drop adheres to each part of the laser apparatus, the parts are contaminated or corroded, thus possibly resulting in a significant reduction of reliability.

Japanese Patent No. 5651396 discloses a fiber laser oscillator in which a laser light source and a fiber laser module are supplied with dry air to be dehumidified. Japanese Patent No. 3338974 discloses a laser apparatus comprising a first cooling water passage provided in a laser oscillation part, a second cooling water passage provided in laser power supply part, a heat exchanger for controlling the temperature of the cooling water, and a pump which supplies the cooling water to the first cooling water passage and the second cooling water passage.

Japanese Unexamined Patent Publication No. 2001-326410 discloses a cooling apparatus for a semiconductor laser, comprising a heat sink in contact with a stack of laminated laser diode bars, and a coolant supply mechanism which supplies cooling water to an internal coolant passage of the heat sink. In this cooling apparatus, whether or not the temperature of the stack is approximate to a value at which a dew condensation occurs is judged to control the flow rate of the cooling water supplied to the coolant passage.

Cooling apparatuses comprising a Peltier element are also known other than those comprising a compressor. For example, Japanese Unexamined Patent Publication No. 2015-12063 discloses an image output apparatus such as a projector comprising a first Peltier element arranged in a first region including a light source device and a second Peltier element arranged at a position spaced from a second region including an optical window to be prevented from the occurrence of dew condensation. In this image output device, the first region is cooled by the first Peltier element and a third region in proximity to the second Peltier element is cooled by the second Peltier element.

In the internal space of the laser apparatus, the temperature increases due to heat radiated from heat generating components or heat transmitted from the outside to the inside of the laser apparatus in accordance with an increase of the environmental temperature or the like. In the laser apparatus, the heat generating components can be cooled by cooling water. As is well known, the laser apparatus is provided with an air-cooling type panel cooler which supplies cooled dry air to the inside of the apparatus to prevent dew condensation from occurring during cooling by the cooling water. The panel cooler can suppress an increase of the internal temperature of the laser apparatus by the heat generating components and lower the dew point of the internal air of the laser apparatus.

However, if a panel cooler and a cooling device using a cooling water are used together, when the environmental temperature increases, the quantity of heat transmitted from the outside increases, but the cooling capacity of the panel cooler decreases. Because of this, it is necessary for the panel cooler to have sufficient leeway with respect to cooling capacity, that is, a large panel cooler must be used, thus leading to an increase of the size of the laser apparatus. Furthermore, an air-cooling type cooler must be provided with an air intake port and foreign matter may enter the inside of the laser apparatus. Consequently, problems with maintenance of the inside of the laser apparatus, the reliability or appearance of the laser apparatus may be caused.

Moreover, depending on the environment in which the laser apparatus is arranged or the season, there are cases where the temperature of the cooling water is too low. In such cases, if cold cooling water is supplied when the laser apparatus begins operating, there is a risk of dew condensation occurring. To prevent this, inconveniently, the laser light source cannot be driven until the temperature of the cooling water reaches a predetermined temperature. Namely, there is a drawback that it takes time to start the operation of the laser apparatus.

SUMMARY OF INVENTION

A laser apparatus according to the present invention comprises a laser oscillation part including a heat receiving part to which heat generated by a laser light source is transmitted and a housing in which a laser oscillation part is arranged. The laser apparatus comprises an air cooling machine having a heat absorption part which absorbs heat of the internal air of the housing, and a dehumidifier having a low temperature part and a high temperature part whose temperature is higher than the low temperature part. The laser apparatus comprises a cooling water supply device including a cooling water pipe through which a cooling water is supplied to the heat receiving part, the heat absorption part and the high temperature part. The air cooling machine and the dehumidifier are arranged in the housing. The housing has a sealed structure in which the internal space is substantially sealed. The cooling water pipe is branched so that the heat receiving part, the heat absorption part, and the high temperature part are connected in parallel. The cooling water supply device supplies a common cooling water of the same temperature to the heat receiving part, the heat absorption part, and the high temperature part.

In the aforementioned invention, the laser light source can be made of a laser diode part including a semiconductor element and can form a light emitting source or excitation light source.

In the aforementioned invention, the laser apparatus can further comprise a heat generating part which generates heat when driven, other than the laser light source, and the heat generating part can be arranged in the housing, and the cooling water pipe can be branched so as to supply the cooling water to the heat generating part, and the cooling water supply device can supply a common cooling water of the same temperature to the heat receiving part, the heat absorption part, the high temperature part, and the heat generating part.

In the aforementioned invention, the dehumidifier can be an electronic cooler having a Peltier element.

In the aforementioned invention, the cooling water pipe can be branched in the housing so as to supply cooling water to the heat receiving part, the heat absorption part and the high temperature part, and branch pipes in which the cooling water discharged from the heat receiving part, the heat absorption part, and the high temperature part respectively flows, can be joined together in the housing.

In the aforementioned invention, the laser apparatus can further comprise a control device for controlling the cooling water supply device. The branch pipes of the cooling water pipes can include a first branch pipe connected to the heat receiving part, a second branch pipe connected to the heat absorption part, and a third branch pipe connected to the high temperature part. The cooling water supply device can include a first electromagnetic valve arranged in the first branch pipe, a second electromagnetic valve arranged in the second branch pipe, and a third electromagnetic valve arranged in the third branch pipe. When the laser apparatus is started, the control device can perform a control to open the third electromagnetic valve and start the dehumidifier, a control to open the first electromagnetic valve and the second electromagnetic valve simultaneously or open the first electromagnetic valve after opening the second electromagnetic valve when the dehumidifier has been operated. The control device can perform a control to supply electricity to the laser light source after the first electromagnetic valve and the second electromagnetic valve are opened. When the laser apparatus is stopped, the control device can perform a control to stop the supply of electricity to the laser light source, and a control to close the first electromagnetic valve and the second electromagnetic valve simultaneously or close the second electromagnetic valve after closing the first electromagnetic valve when the supply of electricity to the laser light source has been stopped. The control device can perform a control to close the third electromagnetic valve after the closure of the first electromagnetic valve and the second electromagnetic valve to thereby stop the dehumidifier.

In the aforementioned invention, the air cooling machine can include a fan which blows the air into the heat absorption part. The low temperature part of the dehumidifier can be arranged on the downstream side of the heat absorption part so that the air cooled by the heat absorption part is brought into contact therewith.

In the aforementioned invention, the laser apparatus can further comprises a control device for controlling the dehumidifier. The high temperature part of the dehumidifier can be connected to the housing so as to transmit heat to the housing. The control device can perform a control to supply the cooling water to the high temperature part and drive the Peltier element with a first drive voltage when the laser oscillation part is driven, and a control to drive the Peltier element with a second drive voltage lower than the first drive voltage without supplying the cooling water to the high temperature part when the laser oscillation part is stopped.

DETAILED DESCRIPTION

With reference to FIGS. 1 to 6, the laser apparatus according to the embodiments of the invention will be discussed below.

Figure 1:
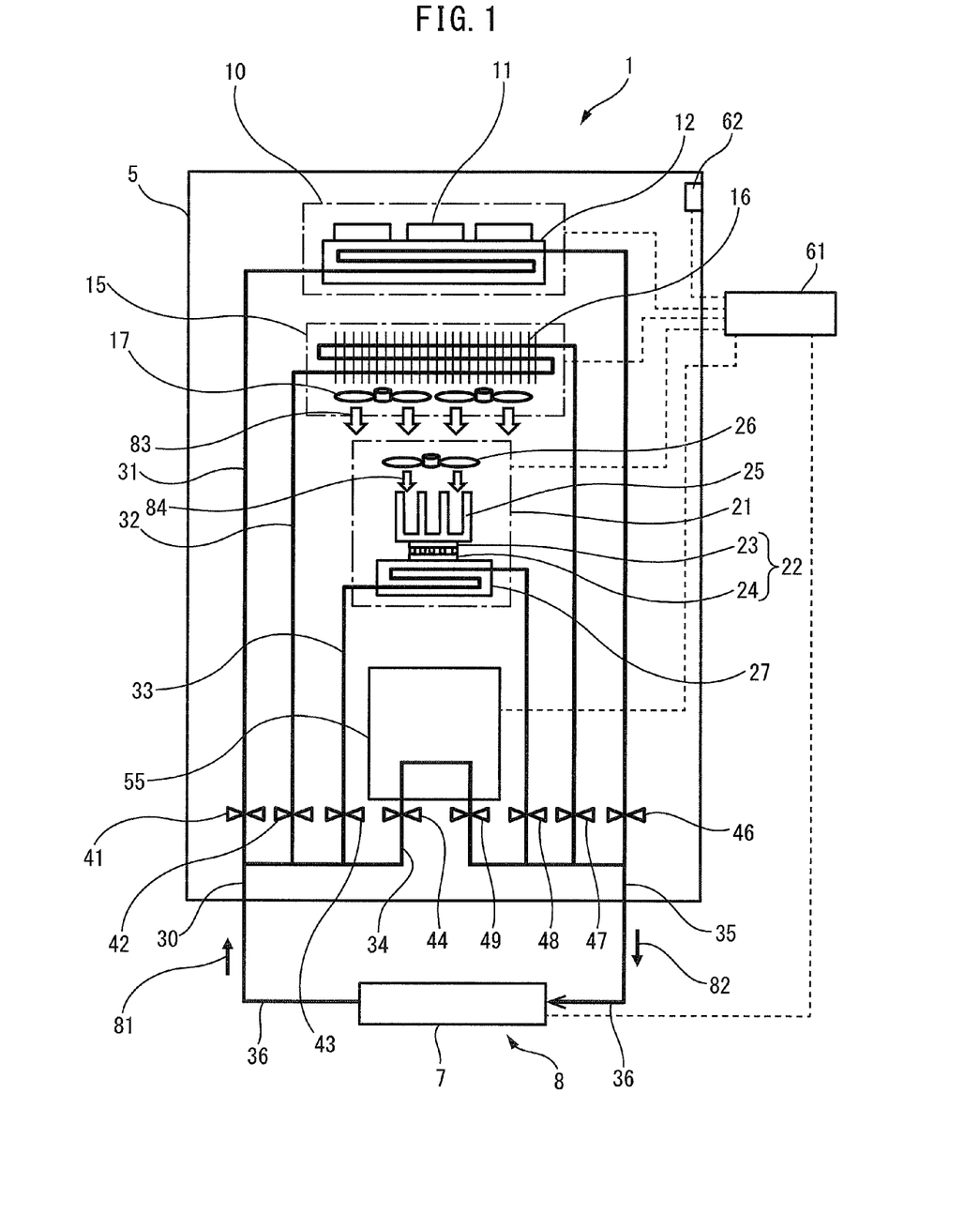
FIG. 1 is a schematic sectional view of a first laser apparatus according to an embodiment.

FIG. 1 shows a schematic sectional view of a laser apparatus according to an embodiment. The first laser apparatus 1 according to the embodiment is a semiconductor laser apparatus. The laser apparatus 1 comprises a housing 5. The housing 5 has a sealed structure in which the internal space is substantially sealed.

The laser apparatus 1 is provided with a laser oscillation part 10 which oscillates laser light. The laser oscillation part includes a laser diode part 11 and a water-cooled plate 12 to which the laser diode part 11 is mounted. The laser diode part 11 forms a laser light source including a semiconductor element. For example, the laser light emitted from the laser diode part 11 is irradiated onto the other member in order to process the other member. Note that, the laser diode part 11 may be used as an excitation light source which emits light for excitation.

The water-cooled plate 12 forms a heat exchanger for cooling the laser diode part 11. In this embodiment, the water-cooled plate 12 is provided, on its outer surface, with a plurality of laser diode parts 11. The water-cooled plate 12 functions as a heat receiving portion to which heat generated in the laser diode parts 11 is transmitted. The water-cooled plate 12 is provided therein with a tube in which cooling water flows.

The laser apparatus 1 comprises an air cooling machine 15 which cools the internal air of the housing 5. The air cooling machine 15 forms a heat absorbing unit. The air cooling machine 15 includes a radiator 16 serving as a heat absorbing part which absorbs heat of the internal air of the housing 5. The radiator 16 is composed of a plurality of fins and a tube which is connected to the fins and in which the cooling water flows. The radiator 16 forms a heat exchanger which is cooled by the cooling water.

The air cooling machine 15 includes heat absorption fans 17 arranged in the vicinity of the radiator 16. The heat absorption fans 17 are fans which cause the air to pass through the radiator 16. When the heat absorption fans 17 are driven, an air flow is produced as indicated by the arrows 83. Consequently, air flows in the radiator 16 to cool the internal air of the housing 5.

The laser apparatus 1 is provided with a dehumidifier 21 which dehumidifies the internal air of the housing 5. The dehumidifier 21 of the first laser apparatus 1 is an electronic cooler. The electronic cooler in this embodiment include a Peltier element 22. The Peltier element 22 includes a low temperature plate 23 of which the temperature decreases when electricity is supplied thereto and a high temperature plate 24 whose temperature becomes higher than the low temperature plate 23. A thermoelectric semiconductor is arranged between the low temperature plate 23 and the high temperature plate 24.

Condensation fins 25, which function as a low temperature part, is connected to the low temperature plate 23. A water-cooled plate 27, which functions as a high temperature part which has a temperature higher than the low temperature part, is connected to the high temperature plate 24. A tube in which the cooling water flows extends through the water-cooled plate 27. The water-cooled plate 27 forms a heat exchanger which is cooled by the cooling water.

The dehumidifier 21 includes a condensation fan 26 by which the air flows through the condensation fins 25. When the condensation fan 26 is driven, an air flow is produced as indicated by the arrows 84. When the Peltier element 22 is driven, the temperature of the condensation fins 25 is decreased. The air is condensed on the surfaces of the condensation fins 25, so that the air in the housing 5 can be dehumidified. When the condensation fan 26 is driven, the air circulates in the housing 5. As a result, the air in the housing 5 can be uniformly dehumidified as a whole. Note that, the waterdrops sticking to the condensation fins 25 drop and are collected in a drain pan. The waterdrops collected in the drain pan are discharged to the outside of the laser apparatus 1.

The laser apparatus 1 comprises an electrical power supply source 55 which supplies electricity to the laser diode parts 11 of the laser oscillation part 10. In this embodiment, the heat absorption fans 17, the condensation fan 26 and the Peltier element 22 are supplied with electricity from another electrical power supply source.

In this embodiment, the laser oscillation part 10, the air cooling machine 15, and the dehumidifier 21 are arranged in the housing 5. Namely, they are arranged in the sealed space. Furthermore, the power supply source 55 is arranged in the housing 5.

The laser apparatus 1 comprises a cooling water supply device 8 which supplies the cooling water. The cooling water supply device 8 supplies the cooling water to the laser oscillation part 10, the air cooling machine 15 and the dehumidifier 21. The cooling water supply device 8 includes a temperature regulator 7 which regulates the temperature of the cooling water. For example, the temperature regulator 7 adjusts the temperature of the cooling water so that the temperature of the cooling water is identical to a predetermined value.

The cooling water supply device 8 includes a cooling water pipe 36 for supplying the cooling water to the water-cooled plate 12 of the laser oscillation part 10, the radiator 16 of the air cooling machine 15 and the water-cooled plate 27 of the dehumidifier 21. The cooling water pipe 36 includes an intake pipe 30 through which the cooling water can be supplied from the temperature regulator 7, as indicated by the arrow 81.

The cooling water pipe 36 includes branch pipes branched from the intake pipe 30. In this embodiment, the cooling water pipe 36 is branched so that the water-cooled plate 12, the radiator 16 and the water-cooled plate 27 are connected in parallel. The cooling water pipe 36 includes a first branch pipe 31 connected to the water-cooled plate 12 of the laser oscillation part 10, a second branch pipe 32 connected to the radiator 16, and a third branch pipe 33 connected to the water-cooled plate 27 of the dehumidifier 21. Furthermore, the cooling water pipe 36 includes a fourth branch pipe 34 connected to the electric power supply source 55.

The first branch pipe 31 extends through the inside of the water-cooled plate 12. The second branch pipe 32 is connected to the fins of the radiator 16. The third branch pipe 33 extends through the inside of the water-cooled plate 27. The fourth branch pipe 34 extends through the inside of the electric power supply source 55. The water-cooled plate 12, the radiator 16, the water-cooled plate 27, and the power supply source 55 can be cooled by the cooling water flowing in the respective branch pipes.

The plurality of branch pipes 31 to 34 are merged after having cooled the respective parts. The first branch pipe 31, the second branch pipe 32, the third branch pipe 33 and the fourth branch pipe 34 are connected to an outlet pipe 35. As indicated by the arrow 82, the cooling water is discharged from the outlet pipe 35. The cooling water is regulated in temperature by the temperature regulator 7 and then, supplied to the intake pipe 30.

A first electromagnetic valve 41 is arranged in the first branch pipe 31 on the upstream side of the water-cooled plate 12. A second electromagnetic valve 42 is arranged in the second branch pipe 32 on the upstream side of the radiator 16. A third electromagnetic valve 43 is arranged in the third branch pipe 33 on the upstream side of the water-cooled plate 27. A fourth electromagnetic valve 44 is arranged in the fourth branch pipe 34 on the upstream side of the power supply source 55. As mentioned above, the electromagnetic valves 41 to 44 are arranged in the respective branch pipes to open or close the respective cooling water passages. When the electromagnetic valves 41 to 44 are opened, the cooling water can be supplied to the respective parts.

A fifth electromagnetic valve 46 is arranged in the flow passage of the first branch pipe 31 where the cooling water is returned from the water-cooled plate 12. A sixth electromagnetic valve 47 is arranged in the flow passage of the second branch pipe 32 where the cooling water is returned from the radiator 16. A seventh electromagnetic valve 48 is arranged in the flow passage of the third branch pipe 33 where the cooling water is returned from the water-cooled plate 27. A eighth electromagnetic valve 49 is arranged in the flow passage of the fourth branch pipe 34 where the cooling water is returned from the power supply source 55. As mentioned above, the electromagnetic valves 46 to 49 are arranged in the respective flow passages where the cooling water is returned from the respective parts. The electromagnetic valves 46 to 49 in this embodiment are opened and closed in synchronization with the electromagnetic valves 41 to 44 arranged in the corresponding branch pipes 31 to 34. By adopting this configuration, it is possible to reliably control the flow of the cooling water in the branch pipes. Note that, the electromagnetic valves 46 to 49 can be dispensed with.

The cooling water supply device 8 in this embodiment is configured to supply the common cooling water to the water-cooled plate 12 as the heat receiving part, the radiator 16 serving as the heat absorbing part, and the water-cooled plate 27 serving as the high temperature part. The cooling water supply device 8 is configured to supply the same temperature cooling water to the respective parts.

The laser apparatus 1 comprises a control device 61. The control device 61 in this embodiment is formed from an arithmetic operation device including a CPU (Central Processing Unit) and a RAM (Random Access Memory), etc. The control device 61 controls the laser oscillation part 10, the air cooling machine 15, and the dehumidifier 21. The control device 61 controls the power supply source 55 and the cooling water supply device 8. In particular, the control device 61 is configured to control the temperature regulator 7, the electromagnetic valves 41 to 44 arranged in the respective branch passages through which the cooling water is supplied, and the electromagnetic valves 46 to 49 arranged in the respective branch passages through which the cooling water is returned.

A humidity sensor 62 is provided in the housing 5 to detect the humidity of the air in the housing 5. In this embodiment, the humidity sensor 62 is located in the vicinity of the laser oscillation part 10. The signal of the humidity detected by the humidity sensor 62 is sent to the control device 61.

Figure 2:
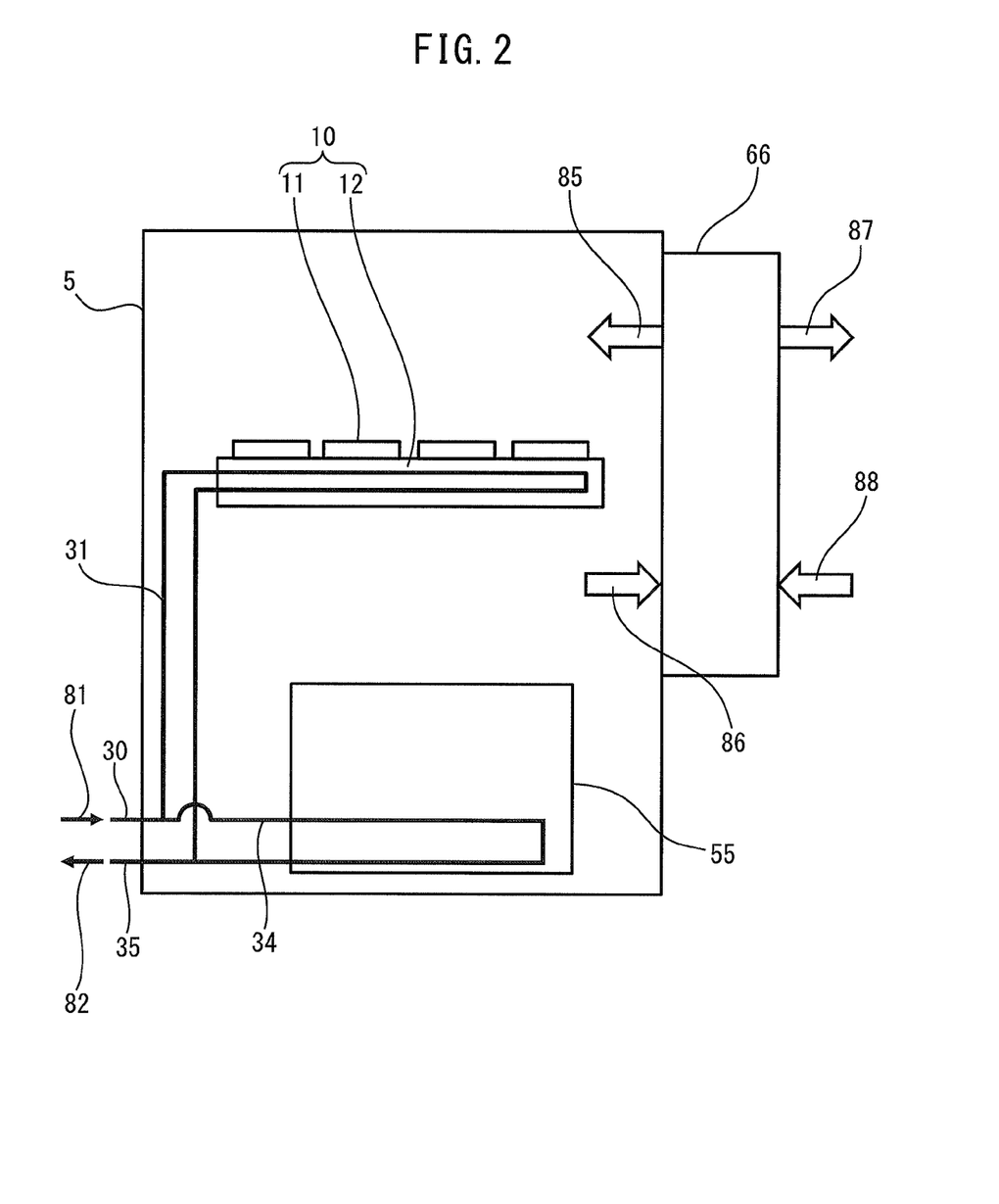
FIG. 2 is a schematic sectional view of a comparative laser apparatus.

FIG. 2 schematically shows a sectional view of a comparative example of laser apparatus. The comparative laser apparatus cools the air in the housing 5 by a panel cooler 66. The laser oscillation part 10 and the power supply source 55 which supplies electricity to the laser oscillation part 10 are arranged in the housing 5. When the laser oscillation part 10 and the power supply source 55 are driven, heat is generated. The laser oscillation part 10 and the power supply source 55 are cooled by the cooling water which flows in the first branch pipe 31 and the fourth branch pipe 34, respectively. However, the temperature of the air in the housing 5 increases. The panel cooler 66 cools and dehumidifies the air in the housing 5.

The panel cooler 66 is arranged on the outside of the housing 5. The panel cooler 66 sucks in the internal air of the housing 5 as indicated by the arrow 86. The panel cooler 66 supplies cooled and dehumidified air into the housing 5, as indicated by the arrow 85. External air is supplied to the panel cooler 66 as indicated by the arrow 88. The panel cooler 66 discharges the air which has been used for cooling as indicated by the arrow 87.

In the comparative laser apparatus, components which are arranged in the housing 5 and which generate heat are cooled by the cooling water. The internal air of the housing 5 is cooled and dried by the panel cooler 66. The cooling capacity of the panel cooler 66 decreases when the ambient temperature increases, because the quantity of heat transmitted from the outside increases. Because of this, in the comparative laser apparatus, it is necessary to use a large-sized panel cooler 66 having sufficient leeway with respect to cooling capacity. As a result, the laser apparatus is large-sized.

With reference to FIG. 1, in the laser apparatus 1 of the present embodiment, the internal air of the housing 5 is cooled by the air cooling machine 15. Furthermore, the internal air of the housing 5 is dehumidified by the dehumidifier 21. In the laser apparatus 1 of this embodiment, no cooling mechanism other than the dehumidifier 21 having the minimum humidifying power is necessary, and accordingly, a highly efficient cooling structure can be realized. The dehumidification of the air in the housing 5 can be performed by a dehumidifier whose cooling capacity is small. In the laser apparatus 1, since the cooling of all of the members is carried out by the circulation-type cooling water supply device 8, the laser apparatus can be miniaturized compared with the apparatus having a panel cooler whose cooling capacity is high. Furthermore, the laser apparatus can be manufactured at a low cost.

The cooling water supply device 8 in this embodiment supplies the cooling water having a substantially identical temperature to the water-cooled plate 12 (heat receiving part) of the laser oscillation part 10 which receives heat from the laser light source, the radiator 16 (heat absorbing part) of the air cooling machine 15 which lowers the temperature of the internal air of the housing 5, and the water-cooled plate 27 (high temperature part) of the dehumidifier 21. Therefore, the temperature of the condensation fins 25 is lower than the temperatures of the water-cooled plates 12 and 27 and the radiator 16. For example, the temperature of the condensation fins 25 is lower than the temperatures of the water-cooled plates 12 and 27 and the radiator 16 by more than several degrees (° C.). Moreover, dew condensation selectively occurs on the condensation fins 25 to thereby dehumidify the air. It is possible to restrain dew condensation from occurring on the water-cooled plates 12 and 27 and the radiator 16.

In particular, when the laser apparatus 1 begins operating, it is possible to restrain dew condensation from occurring on the portions other than the condensation fins 25 even at a low temperature of the cooling water. It is possible to start the operation of the laser apparatus within a short period of time substantially without being influenced by the ambient temperature of the laser apparatus 1.

As the ambient temperature rises, the temperature of the internal air of the housing 5 rises. In the comparative laser apparatus, when the ambient temperature rises, the cooling capacity is reduced because the air-cooling type panel cooler 66 is used. In contrast thereto, in the embodiment of the invention, the quantity of heat absorbed by the radiator 16 of the air cooling machine 15 is approximately proportional to the difference in temperature between the air in contact therewith and the cooling water. The cooling water whose temperature is substantially constant is supplied to the radiator 16. The cooling capacity (quantity of heat to be absorbed) of the air cooling machine 15 increases as the temperature of the air in contact with the radiator 16 increases. Namely, the cooling capacity of the air cooling machine 15 increases as the ambient temperature increases. Because of this, an increase in temperature of the internal air of the housing 5 caused by an increase of the ambient temperature is effectively suppressed. Moreover, as the water-cooled plate 27 is cooled by the cooling water whose temperature is almost constant, substantially no increase of the temperature of the condensation fins 25 of the dehumidifier 21 occurs, whereby the air can be effectively dehumidified.

The laser source in the present embodiment, is composed of laser diode parts 11 including semiconductor elements. When dew condensation occurs on the laser diode parts 11 and dense wiring portions around the laser diode parts 11, etc., there may be serious damage such as burnout due to a short-circuit. The present invention can be advantageously applied to a semiconductor laser apparatus including laser diode parts 11, etc. In the laser apparatus 1 according to this embodiment, since dew condensation selectively occurs on the condensation fins 25 rather than the water-cooled plate 12 which receives heat of the laser diode parts 11, it is possible to effectively restrain the laser diode parts 11 from being broken.

Moreover, in this embodiment, the power supply source 55 is arranged in the housing 5. The power supply source 55 corresponds to a heat generating part which generates heat when driven, other than the laser light source. The cooling water pipe 36 is branched so that the cooling water is supplied to the power supply source 55. The cooling water supply device 8 supplies the common cooling water to the water-cooled plates 12, 27, the radiator 16 and the power supply source 55. By directly cooling the heat generating parts other than the laser light source by the cooling water, more effective cooling than the cooling by the use of air in the housing 5 can be achieved. It is possible to restrain dew condensation from occurring on the heat generating parts other than the laser light source.

The heat generating parts other than the laser slight source are not limited to the power supply source, and may be any member which generates heat in the housing. For example, an electric circuit or a transformer which generates heat corresponds to the heat generating part. In the laser apparatus 1 according to this embodiment, all the quantity of heat generated in the housing 5 is transferred by the use of the cooling water besides natural convection and radiation. Therefore, it is not necessary for the housing 5 to have an air intake port or air discharge port. Due to the absence of the air intake port and discharge port in the housing 5, it is possible to restrain dust or dirt from entering the laser apparatus 1, thus leading to a breakdown of the laser apparatus. Furthermore, no replacement of a filter arranged in the air intake port is necessary. As a result, not only can the reliability of the laser apparatus 1 be enhanced but also the maintenance can be facilitated. Moreover, the appearance of the laser apparatus 1 is improved.

The dehumidifier 21 of the present embodiment is an electronic cooler having a Peltier element 22. The cooling capacity of the electronic cooler is not so high, but in the laser apparatus 1 of the present embodiment of the invention, it is used not to cool but to dehumidify the air. Therefore, the cooling capacity of the electronic cooler is large enough to dehumidify the air. Furthermore, the electronic cooler has advantages that the energy consumption is small, failure occurs less frequently, and the size is small.

The cooling water pipe 36 of the present embodiment is branched in the housing 5 to supply the cooling water to the water-cooled plates 12, 27 and the radiator 16. The branch pipes in which the cooling water discharged from the water-cooled plates 12, 27 and the radiator 16 flows are joined together in the housing 5. By adopting this configuration, it is possible to locate the portion where the cooling water pipe is branched in the vicinity of the heat exchange. Consequently, it is possible to restrain the temperatures of the cooling water supplied to the water-cooled plates 12, 27 and the radiator 16 from differing. Moreover, when the laser apparatus 1 is installed in a desired place, the number of the connections of the cooling water pipes is reduced, thus resulting in facilitation of the installation of the laser apparatus 1.

The air cooling machine 15 includes the heat absorption fans 17 by which the air is blown into the radiator 16. The condensation fins 25 are arranged downstream of the radiator 16 so that the air cooled by the radiator 16 is brought into contact therewith. Namely, when the heat absorption fans 17 are driven, the air flow is produced as indicated by the arrows 83. The condensation fins 25 are arranged on the downstream side of the radiator 16 in the direction of the air flow. The air which has passed the radiator 16 has a decreased temperature and an increased humidity. Since the humid air can be brought into contact with the condensation fins 25 of the dehumidifier 21, the dew condensation can be promoted. As a result of this, the inside of the housing 5 can be effectively dehumidified.

The housing 5 of the present embodiment is formed so that the internal space thereof is substantially sealed. It is preferable that the housing 5 be completely sealed. However, it is sufficient that the housing 5 is sufficiently sealed so that it can be dehumidified by the dehumidifier 21 and the air can be cooled by the air cooling machine 15. Namely, as long as the housing 5 can be dehumidified by the dehumidifier 21, the housing 5 may permit a slight amount of air to enter therein or exit therefrom.

Figure 3:
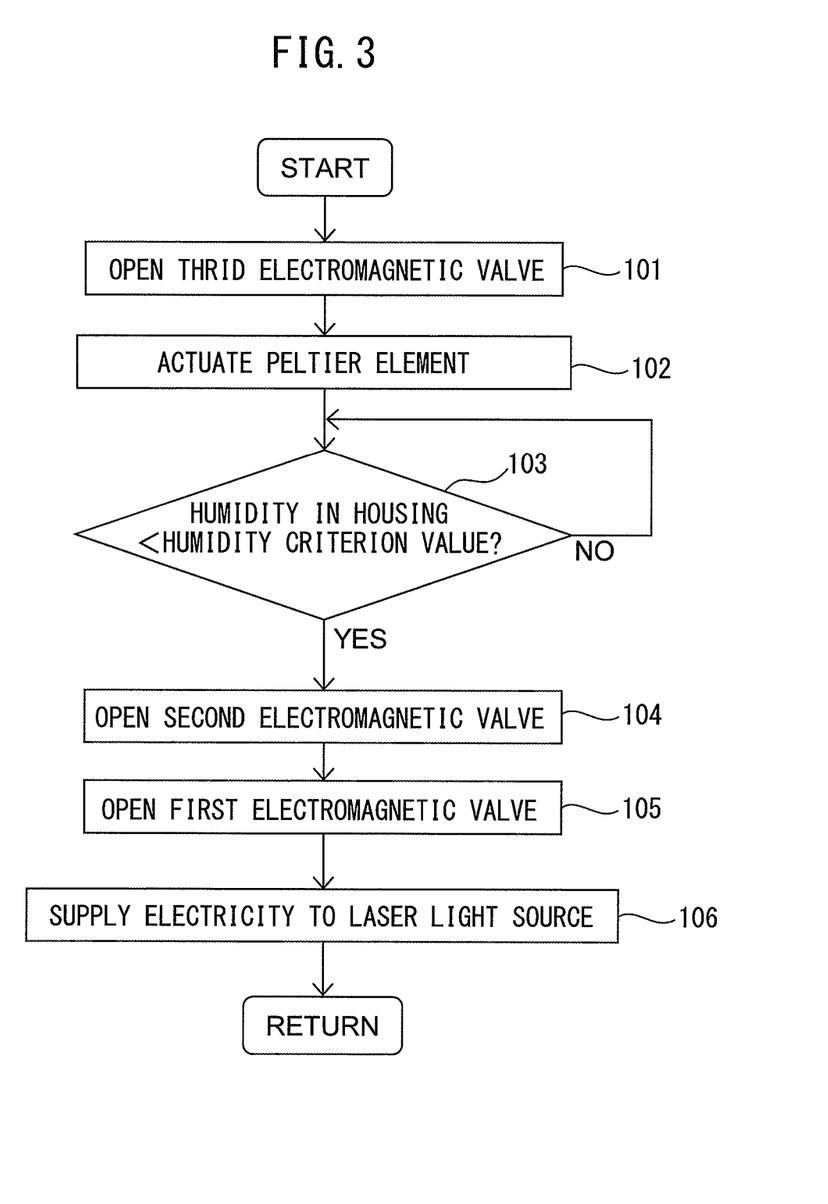
FIG. 3 is a flow chart of a control to start the operation of the laser apparatus according to the embodiment.

FIG. 3 shows a flow chart of the control operation when the laser apparatus is operated. With reference to FIGS. 1 and 3, when the laser apparatus 1 is started, the operator inputs a command to start the operation to a control device 61. The control device 61 drives the temperature regulator 7 so as to control the temperature of the cooling water. The temperature regulator 7 is controlled so that the temperature of the cooling water supplied as indicated by the arrow 81 is maintained at a predetermined value.

At step 101, the control device 61 opens the third electromagnetic valve 43 and the seventh electromagnetic valve 48. The cooling water is supplied to the water-cooled plate 27 of the dehumidifier 21. Note that the electromagnetic valves 46 to 49 arranged on the side on which the cooling water is discharged may be continuously opened.

At step 102, the control device 61 causes the Peltier element 22 to be supplied with electricity to be operated. The temperatures of the low temperature plate 23 of the Peltier element 22 and the condensation fins 25 decrease. The temperature of the high temperature plate 24 increases, but the high temperature plate 24 can be cooled by the water-cooled plate 27. Furthermore, the control device 61 drives the condensation fan 26. The control device 61 drives the dehumidifier 21. The internal air of the housing 5 can be dehumidified by actuation of the dehumidifier 21. The humidity of the inside of the housing 5 can be reduced.

Next, at step 103, the control device 61 judges whether or not the internal humidity of the housing 5 is sufficiently low. The control device 61 judges whether or not the humidity of the internal air of the housing 5 is below a predetermined humidity criterion value. The humidity of the internal air of the housing 5 can be detected by the humidity sensor 62. The humidity criterion value can be, for example, a low humidity at which no dew condensation occurs even when the cooling water is supplied to the water-cooled plate 12 and the radiator 16. At step 103, if the humidity of the internal air of the housing 5 is above the humidity criterion value, the aforementioned control is repeated. If the humidity of the internal air of the housing 5 is not higher than the humidity criterion value, the control proceeds to step 104.

At step 104, the control device 61 opens the second electromagnetic valve 42 and the sixth electromagnetic valve 47. Also, the control device 61 drives the heat absorption fans 17. Thus, the control device 61 drives the air cooling machine 15, whereby the cooling operation of the internal air of the housing 5 can be commenced.

Next, at step 105, the control device 61 opens the first electromagnetic valve 41 and the fifth electromagnetic valve 46. With this control, the cooling water can be supplied to the water-cooled plate 12.

At step 106, the control device 61 opens the fourth electromagnetic valve 44 and the eighth electromagnetic valve 49 to actuate the power supply source 55. The control device 61 begins supplying electricity to the laser diode parts 11. Namely, the laser oscillation part 10 commences the oscillation of laser light.

Note that, in the present embodiment, the first electromagnetic valve 41 is opened after the second electromagnetic valve 42 is opened, but the invention is not limited thereto. The second electromagnetic valve 42 and the first electromagnetic valve 41 may be opened simultaneously. For example, the air cooling machine 15 and the laser oscillation part 10 may be started simultaneously.

In the control at the commencement of the operation of the laser apparatus 1 according to the present embodiment, the dehumidifier 21 is first started, and when the humidity is reduced, the cooling water is supplied to the water-cooled plate 12 of the laser oscillation part 10 and the radiator 16 of the air cooling machine 15. Accordingly, it is possible to effectively restrain dew condensation from occurring on the portions other than the condensation fins 25 of the dehumidifier 21. In particular, it is possible to effectively restrain dew condensation from occurring on the laser oscillation part 10. The laser diode parts 11 can be supplied with electricity at a low humidity to thereby suppress failure of the laser oscillation part 10.

Note that, in the aforementioned control, the second electromagnetic valve 42 is opened when the internal humidity of the housing 5 is lower than the humidity criterion value, but the invention is not limited thereto. The second electromagnetic valve 42 may be opened after a predetermined period of time has elapsed from the commencement of the operation of the Peltier element 22 at step 102.

Figure 4:
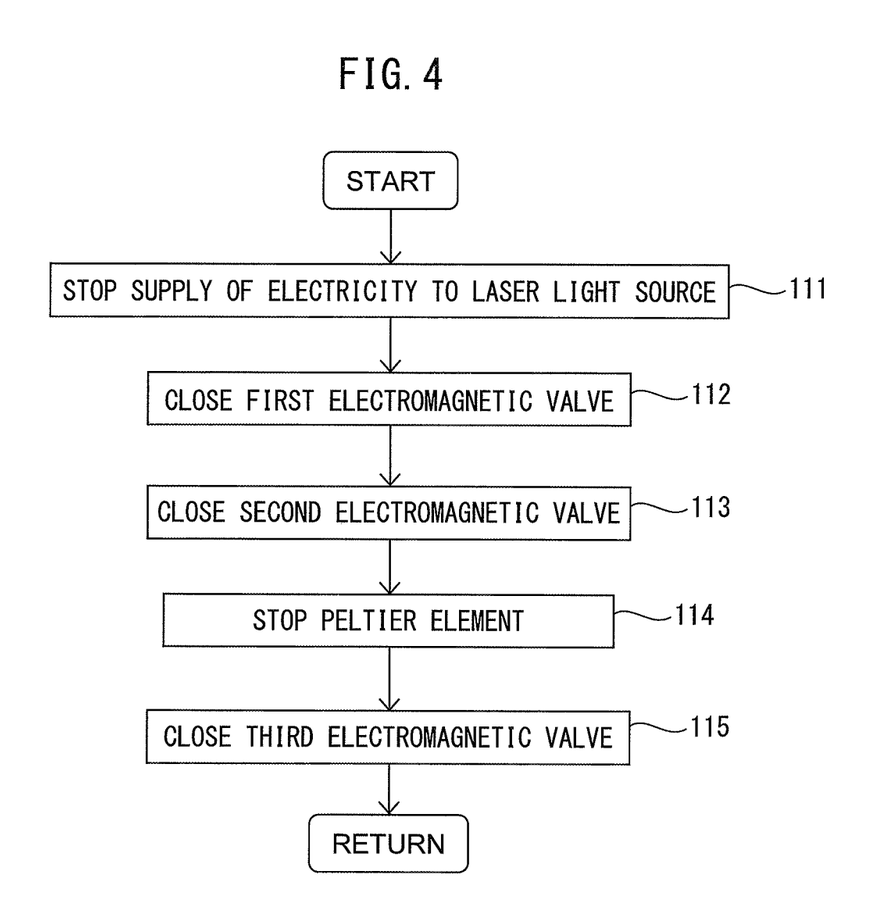
FIG. 4 is a flow chart of a control to stop the operation of the laser apparatus according to the embodiment.

FIG. 4 shows a flow chart of the control when the laser apparatus according to the present embodiment is stopped. When the laser apparatus 1 emits the laser light, the electromagnetic valves 41 to 44 and 46 to 49 are opened and the laser diode parts 11 are supplied with electricity.

At step 111, the control device 61 stops supplying electricity to the laser diode parts 11. The laser oscillation part 10 stops oscillation of the laser light.

Next, at step 112, the control device 61 closes the first electromagnetic valve 41 and the fifth electromagnetic valve 46. Namely, the supply of the cooling water to the water-cooled plate 12 of the laser oscillation part 10 is stopped. Furthermore, the control device 61 stops the power supply source 55 and closes the fourth electromagnetic valve 44 and the eighth electromagnetic valve 49.

At step 113, the control device 61 closes the second electromagnetic valve 42 and the sixth electromagnetic valve 47 after a predetermined period of time has elapsed from the stoppage of the supply of electricity. Namely, the control device 61 stops the supply of the cooling water to the air cooling machine 15. Furthermore, the control device 61 stops the heat absorption fans 17. Note that, the operations at step 112 and step 113 may be performed at the same time. For example, the air cooling machine 15 and the laser oscillation part 10 may be stopped simultaneously.

Next, at step 114, the control device 61 closes the second electromagnetic valve 42, and after a predetermined period of time has elapsed, stops the Peltier element 22 of the dehumidifier 21. Namely, supply of electricity to the Peltier element 22 is stopped. Furthermore, the control device 61 stops the operation of the condensation fan 26.

Next, at step 115, the control device 61 closes the third electromagnetic valve 43 and the seventh electromagnetic valve 48 when a predetermined period of time has elapsed from the stoppage of the operation of the Peltier element 22. Thus, the control device 61 stops the supply of the cooling water to the water-cooled plate 27 of the dehumidifier 21. The control device 61 stops the cooling water supply device 8.

In the control of the laser apparatus 1 of the present embodiment at the termination of the operation, the dehumidifier 21 is stopped after the laser oscillation part 10 and the air cooling machine 15 are stopped. Therefore, it is possible to effectively restrain dew condensation from occurring on the portions other than the condensation fins 25 of the dehumidifier 21. In particular, it is possible to effectively restrain dew condensation from occurring on the laser oscillation part 10. It is possible to maintain a low humidity until the supply of electricity to the laser diode parts 11 is stopped, to thereby reduce failure of the laser oscillation part 10.

With reference to FIGS. 3 and 4, the electromagnetic valves 44 and 49 through which the cooling water supplied to the power supply source 55 can be opened at any time of the beginning stage of the operation after the air in the housing 5 is lower than the humidity criterion value. Furthermore, at the stopping stage, the electromagnetic valves 44 and 49 can be closed at any time prior to stoppage of the dehumidifier 21. For example, the electromagnetic valves 44 and 49 may be opened or closed at the same time as the first electromagnetic valve 41. When the cooling water is supplied to the heat generating parts other than the power supply source 55, the same control as mentioned above can be carried out by arranging electromagnetic valves in the branch pipes.

Figure 5:
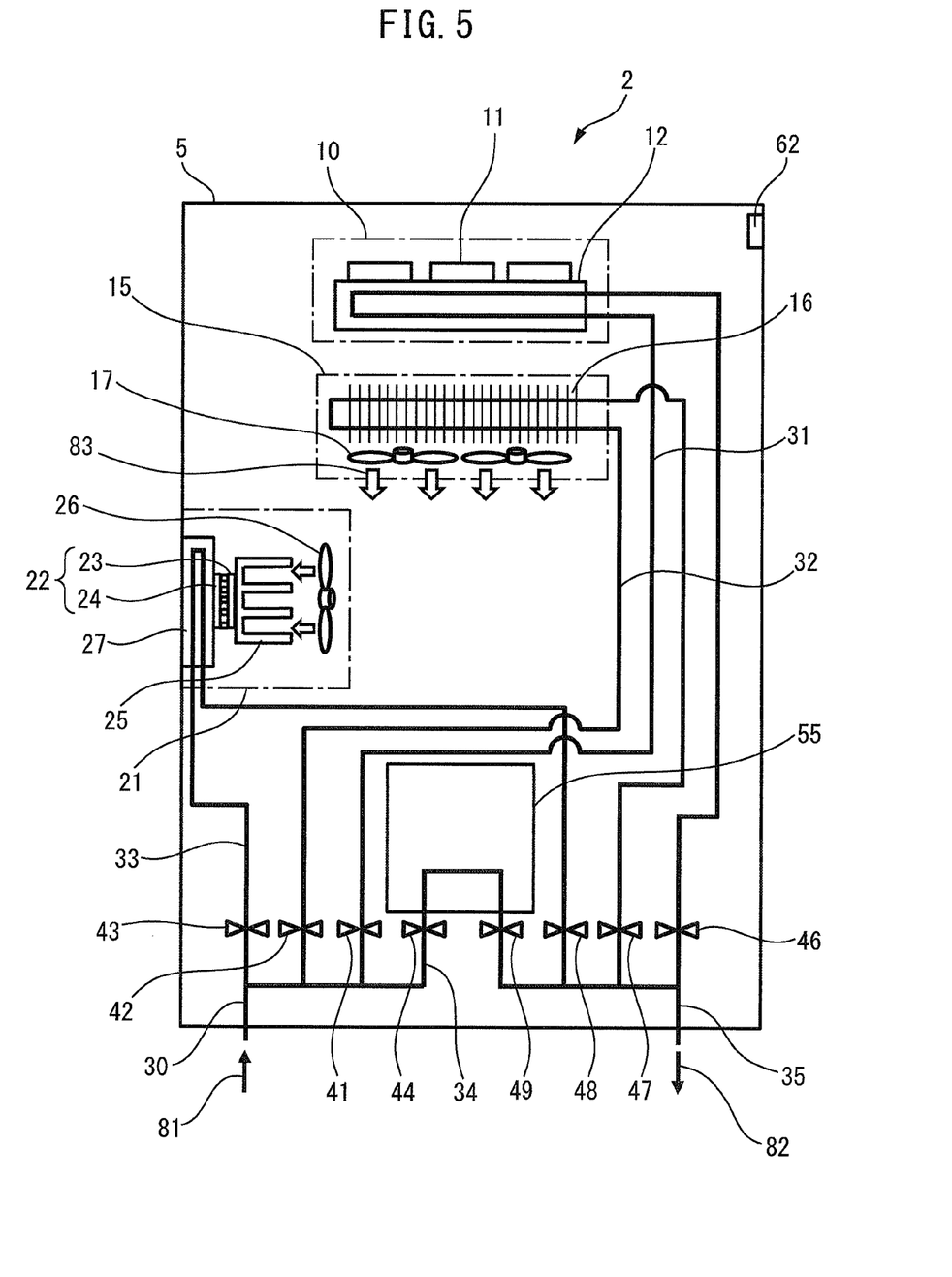
FIG. 5 is a schematic sectional view of a second laser apparatus according to the embodiment.

FIG. 5 schematically shows a sectional view of the main body of the second laser apparatus of the invention. The second laser apparatus 2 is provided with a control device and a temperature regulator similar to the first laser apparatus 1. The second laser apparatus 2 is different from the first laser apparatus 1 in the arrangement of the dehumidifier 21. In the dehumidifier 21 of the second laser apparatus 2, the water-cooled plate 27 which functions as a high temperature part is in contact with the housing 5. The water-cooled plate 27 is connected to the housing 5 so as to transfer heat to the housing 5.

When the drive voltage of the Peltier element 22 is reduced, the cooling capacity decreases, but the cooling efficiency increases. The dehumidifier 21 fulfills the dehumidification function only by radiating heat to the housing 5. Therefore, it is possible to dehumidify the internal air of the housing 5 without supplying the cooling water to the third branch pipe 33.

In the second laser apparatus 2, the control device 61 performs to a control to supply the cooling water to the water-cooled plate 27 when the laser oscillation part 10 is driven. This control is the same as that of the first laser apparatus 1. The control device 61 drives the Peltier element 22 with the first drive voltage when the laser oscillation part 10 is driven. In contrast, the control device 61 drives the Peltier element 22 with the second drive voltage without supplying the cooling water to the water-cooled plate 27 when the operation of the laser oscillation part 10 is stopped. The second drive voltage is lower than the first drive voltage.

The internal air of the housing 5 can be dehumidified by supplying electricity to the Peltier element 22 while the operation of the laser oscillation part 10 is stopped. In the case where the operation of the laser oscillation part 10 is stopped for a long period of time, the internal air of the housing can be maintained at a low humidity. The starting time of the laser apparatus 2 can be shortened. Furthermore, it is possible to restrain dew condensation from occurring in the laser apparatus 2 in accordance with climatic changes or environmental changes during the period of stoppage of the operation of the laser oscillation part 10. It is possible to restrain the reliability from decreasing due to the occurrence of dew condensation in the laser apparatus 2, leading to corrosion or contamination of the parts.

Note that, when carrying out the control at the start shown in FIG. 3, it is possible to carry out the control in which the drive voltage of the Peltier element 22 is increased from the second drive voltage to the first drive voltage at step 102. When carrying out the control at the stoppage shown in FIG. 4, it is possible to carry out the control in which the drive voltage applied to the Peltier element 22 is decreased from the first drive voltage to the second drive voltage at step 114.

The other structures, mode of operation and effects of the second laser apparatus 2 are the same as those of the first laser apparatus 1, and accordingly, no explanation therefor will be given hereinafter.

Figure 6:
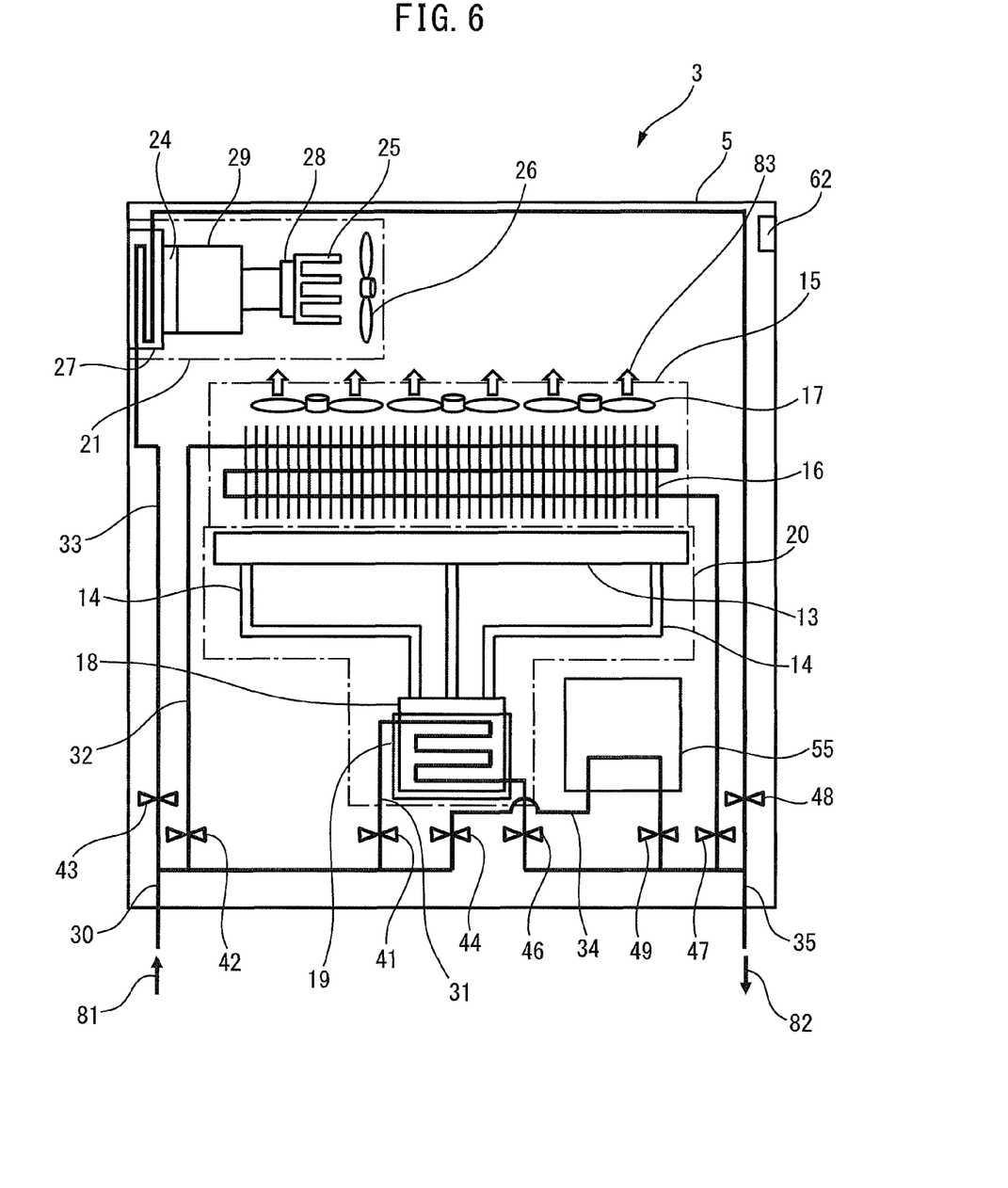
FIG. 6 is a schematic sectional view of a third laser apparatus according to the embodiment.

FIG. 6 schematically shows the main body of a third laser apparatus. The third laser apparatus 3 is a carbon dioxide laser apparatus. The laser oscillation part 20 of the third laser apparatus 3 includes a discharge tube 13 filled therein with carbon dioxide and a gas tube 14 for circulating carbon dioxide. The gas is discharged in the discharge tube 13 so as to excite the laser light. The discharge tube 13 corresponds to the laser light source.

The laser oscillation part 20 includes a turbo-blower 18 serving as a blower for cooling the air whose temperature has increased in the discharge tube 13. The turbo-blower 18 is connected to the discharge tube 13 by gas pipes 14. The laser oscillation part 20 includes a water-cooling jacket 19 for cooling the turbo-blower 18. In the third laser apparatus 3, the water-cooling jacket 19 corresponds to a heat receiving part to which heat generated by the laser light source is transmitted. A first branch pipe 31 extends through the water-cooling jacket 19. The water-cooling jacket 19 is cooled by the cooling water which flows in the first branch pipe 31.

The air cooling machine 15 of the third laser apparatus 3 is configured to have the same structure as the air cooling machine of the first laser apparatus 1. The air cooling machine 15 includes a radiator 16 to which a second branch pipe 32 is connected and heat absorption fans 17.

In the third laser apparatus 3, the dehumidifier 21 which dehumidifies the air in the housing 5 includes a circulation type cooling machine 29 provided with a compressor. In the circulation type cooling machine 29, the cooling head 28 has a low temperature and the high temperature plate 24 has a high temperature due to heat generated by the compressed coolant. The high temperature plate 24 is secured to the water-cooled plate 27 and is cooled by the water-cooled plate 27. The condensation fins 25 are secured to the cooling head 28. The condensation fan 26 is arranged to be opposed to the condensation fins 25. The condensation fins 25 correspond to the low temperature part of the dehumidifier 21. The water-cooled plate 27 corresponds to the high temperature part. A third branch pipe 33 extends through the water-cooled plate 27. As described above, the dehumidifier is not limited to an electronic cooler and may be a small circulation type cooling machine, etc.

In the third laser apparatus 3, a high voltage is applied to the electrodes arranged in the discharge tube 13 in order to emit laser light. Therefore, if dew condensation occurs in the housing 5, a spark may occur and may damage the electrodes or the parts arranged in the vicinity of the discharge tube 13. In the third laser apparatus 3, dew condensation is selectively caused in the condensation fins 25, whereby damage to the laser apparatus 3 due to dew condensation can be suppressed. Furthermore, the third laser apparatus 3 can be miniaturized in the same manner as the first laser apparatus 1.

The remaining structures, mode of operation and effects of the third laser apparatus 3 are the same as those of the first laser apparatus 1 or the second laser apparatus 2, and no explanation therefor will be given hereinafter.

The present invention can be advantageously applied to a laser apparatus in which the laser light with high power is emitted and a large quantity of heat is generated by the laser light source. Such a high output laser apparatus is exemplified, for example, by a laser cutting machine or a laser beam welding machine for metal plates.

The present invention can provide a laser apparatus which is relatively small and inexpensive compared with a laser apparatus having an equivalent performance to suppress dew condensation.

In the aforementioned control in the respective embodiments, the sequence of the steps can be appropriately modified as long as the same function and mode of operation are provided. The aforementioned embodiments can be appropriately combined. In the drawings, the same or corresponding components are assigned the same reference numerals. Note that, the aforementioned embodiments are examples and do not limit the invention. Moreover, the embodiments include modifications of the embodiments described in the claims.

The invention claimed is:

1. A laser apparatus comprising:
a laser oscillation part including a heat receiving part to which heat generated by a laser light source is transmitted;
a housing in which the laser oscillation part is arranged;
an air cooling machine having a heat absorption part which absorbs heat of internal air of the housing;
a dehumidifier having a low temperature part and a high temperature part whose temperature is higher than the low temperature part; and
a cooling water supply device including a cooling water pipe through which a cooling water is supplied to the heat receiving part, the heat absorption part and the high temperature part, wherein
the air cooling machine and the dehumidifier are arranged in the housing,
the housing has a sealed structure in which the internal space is substantially sealed,
the cooling water pipe is branched so that the heat receiving part, the heat absorption part, and the high temperature part are connected in parallel, and
the cooling water supply device supplies a common cooling water of the same temperature to the heat receiving part, the heat absorption part, and the high temperature part.

2. The laser apparatus according to claim 1, wherein the laser light source is made of a laser diode part including a semiconductor element and forms a light emitting source or an excitation light source.

3. The laser apparatus according to claim 1, further comprising a heat generating part which generates heat when driven, other than the laser light source, wherein
the heat generating part is arranged in the housing,
the cooling water pipe is branched so as to supply the cooling water to the heat generating part, and
the cooling water supply device supplies the common cooling water of the same temperature to the heat receiving part, the heat absorption part, the high temperature part, and the heat generating part.

4. The laser apparatus according to claim 1, wherein the dehumidifier is an electronic cooler having a Peltier element.

5. The laser apparatus according to claim 1, wherein the cooling water pipe is branched in the housing so as to supply a cooling water to the heat receiving part, the heat absorption part, and the high temperature part, and branch pipes in which the cooling water discharged from the heat receiving part, the heat absorption part, and the high temperature part respectively flows, are joined together in the housing.

6. The laser apparatus according to claim 1, further comprising a control device for controlling the cooling water supply device, wherein
branch pipes of the cooling water pipe include a first branch pipe connected to the heat receiving part, a second branch pipe connected to the heat absorption part, and a third branch pipe connected to the high temperature part, the cooling water supply device includes a first electromagnetic valve arranged in the first branch pipe, a second electromagnetic valve arranged in the second branch pipe, and a third electromagnetic valve arranged in the third branch pipe, when the laser apparatus is started, the control device performs a control to open the third electromagnetic valve and start the dehumidifier, a control to open the first electromagnetic valve and the second electromagnetic valve simultaneously or open the first electromagnetic valve after opening the second electromagnetic valve when the dehumidifier has been operated, and a control to supply electricity to the laser light source after the first electromagnetic valve and the second electromagnetic valve are opened, and when the laser apparatus is stopped, the control device performs a control to stop the supply of electricity to the laser light source, a control to close the first electromagnetic valve and the second electromagnetic valve simultaneously or close the second electromagnetic valve after closing the first electromagnetic valve when the supply of electricity to the laser light source has been stopped, and a control to close the third electromagnetic valve after the closure of the first electromagnetic valve and the second electromagnetic valve to stop the dehumidifier.

7. The laser apparatus according to claim 1, wherein
the air cooling machine includes a fan which blows the air into the heat absorption part, and
the low temperature part is arranged on the downstream side of the heat absorption part so that the air cooled by the heat absorption part is brought into contact therewith.

8. The laser apparatus according to claim 4, further comprising a control device for controlling the dehumidifier, wherein
the high temperature part of the dehumidifier is connected to the housing so as to transmit heat to the housing, and
the control device performs a control to supply the cooling water to the high temperature part and drive the Peltier element with a first drive voltage when the laser oscillation part is driven, and a control to drive the Peltier element with a second drive voltage lower than the first drive voltage without supplying the cooling water to the high temperature part when the laser oscillation part is stopped.

* * * * *